(12) United States Patent
Hofmann et al.

(10) Patent No.: US 7,824,973 B2
(45) Date of Patent: Nov. 2, 2010

(54) METHOD OF FORMING A SEMICONDUCTOR DEVICE AND SEMICONDUCTOR DEVICE THEREOF

(75) Inventors: Karl Hofmann, Munich (DE); Stefan Decker, Munich (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 12/244,106

(22) Filed: Oct. 2, 2008

(65) Prior Publication Data

US 2010/0084693 A1  Apr. 8, 2010

(51) Int. Cl.
*H01L 21/337* (2006.01)
(52) U.S. Cl. .................. 438/194; 438/217; 438/376; 438/377; 257/E29.279; 257/E29.268
(58) Field of Classification Search .......... 257/E29.279, 257/E29.268; 438/194, 217, 376
See application file for complete search history.

(56) References Cited

U.S. PATENT DOCUMENTS

| 7,045,405 B2 * | 5/2006 | Tran ............................. 438/197 |
| 2004/0014303 A1 * | 1/2004 | Layman et al. ............. 438/525 |
| 2006/0071183 A1 * | 4/2006 | Shibata et al. ......... 250/492.23 |

* cited by examiner

*Primary Examiner*—Fernando L Toledo
*Assistant Examiner*—Mamadou Diallo

(57) ABSTRACT

According to one embodiment of the present invention, a method of forming a semiconductor device is provided, the method including: forming a substrate; forming a first gate on the substrate; forming a mask layer on the substrate, the mask layer including a first window covering an area within which the first gate is formed so that the first gate divides the substrate exposed by the first window into a first region and a second region; and doping the exposed substrate using rays inclined with respect to the substrate top surface, where the position of the first gate with respect to a border of the first window is chosen such that the inclined doping rays impinge more on the first region than on the second region.

25 Claims, 15 Drawing Sheets

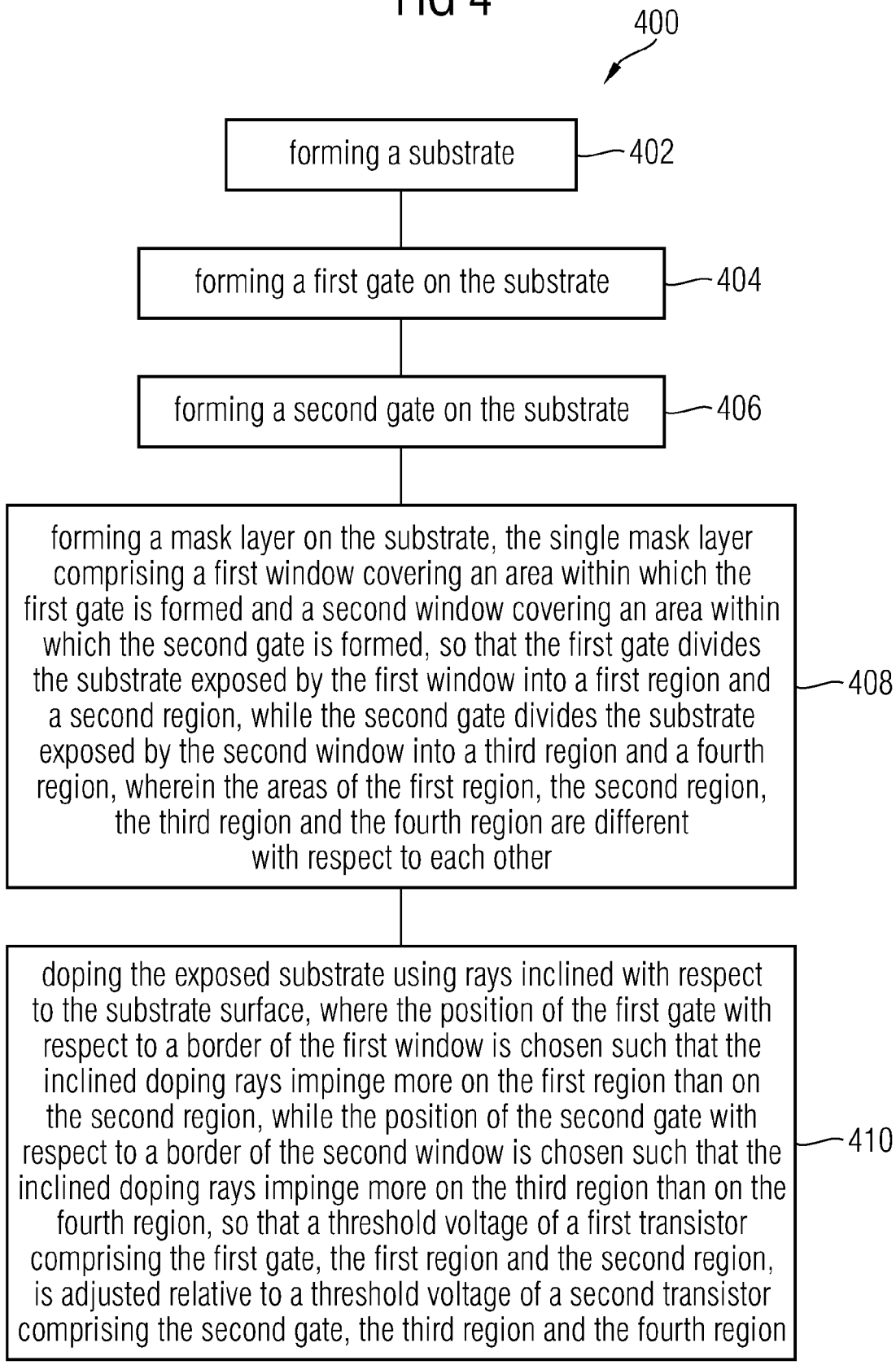

FIG 8

| MODULE | LITHO LEVEL |
| --- | --- |
| ■ STI | RX, KV |
| ■ Wells | NW, BF, N3 |
| ■ Vt implants | XW, LW, NV, PV, PR, NR, IP, IN, JP, JN |
| ■ Gate Oxide | EG, DG / IG |
| ■ Poly | ZP, PC, BK |
| ■ Spacer1 | — |
| ■ Extension/Halo implants | PH, BH, GP, GN, DE, DF |
| ■ Spacer2 | — |
| ■ S/D | BP, BN |
| ■ Silicide Block | OP |
| ■ Stress Liner | XN (single liner), WP, WN (dual liner) |
| ■ Contact | CA |

Figure 1: C65LP CMOS integration flow by modules and lithography levels

US 7,824,973 B2

METHOD OF FORMING A SEMICONDUCTOR DEVICE AND SEMICONDUCTOR DEVICE THEREOF

BACKGROUND OF INVENTION

Usually, the threshold voltage of a transistor is adjusted by implants. A higher implant dosage increases the threshold voltage of the transistor.

In a standard CMOS (Complementary Metal Oxide Semiconductor) fabrication process, the threshold voltage of a transistor is adjusted by threshold voltage implants together with well implants. Threshold voltage implants are performed under low energy, so that the doping occurs mainly at the surface, while well implants are typically done at high energy levels. FIG. 8 provides an overview of modules and their respective required lithography levels used in a C65LP process.

Transistors with high threshold voltage values, i.e. transistors having a low leakage current may not be suitable for high performance applications. On the other hand, while regular threshold voltage value transistors may be suitable for high performance applications, such devices suffer from higher current leakage.

Fabricating a semiconductor device with transistors having different threshold voltage levels requires additional masks. As an example, a CMOS element fabrication process would require two additional masks, one for the NMOS transistor of the CMOS element and the other for the PMOS transistor of the CMOS element. These additional masks increase the semiconductor processing costs.

It is thus desirable to fabricate transistors with different threshold voltages without additional masks.

SUMMARY OF INVENTION

According to one embodiment of the present invention, a method of forming a semiconductor device is provided, the method including: forming a substrate; forming a first gate on the substrate; forming a mask layer on the substrate, the mask layer including a first window covering an area within which the first gate is formed so that the first gate divides the substrate exposed by the first window into a first region and a second region; and doping the exposed substrate using rays inclined with respect to the substrate top surface, wherein the position of the first gate with respect to a border of the first window is chosen such that the inclined doping rays impinge more on the first region than on the second region.

According to one embodiment of the present invention, a semiconductor device is provided, including: a substrate; a gate provided on the substrate; and a channel region formed within in the substrate below the gate, the channel region spanning the length of the gate and having an asymmetric arc shaped doping concentration profile.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a flowchart of a method of fabricating a semiconductor device according to one embodiment of the present invention;

FIG. 8 shows an overview of modules and their respective required lithography levels used in a C65LP process.

DESCRIPTION

Figure 1:
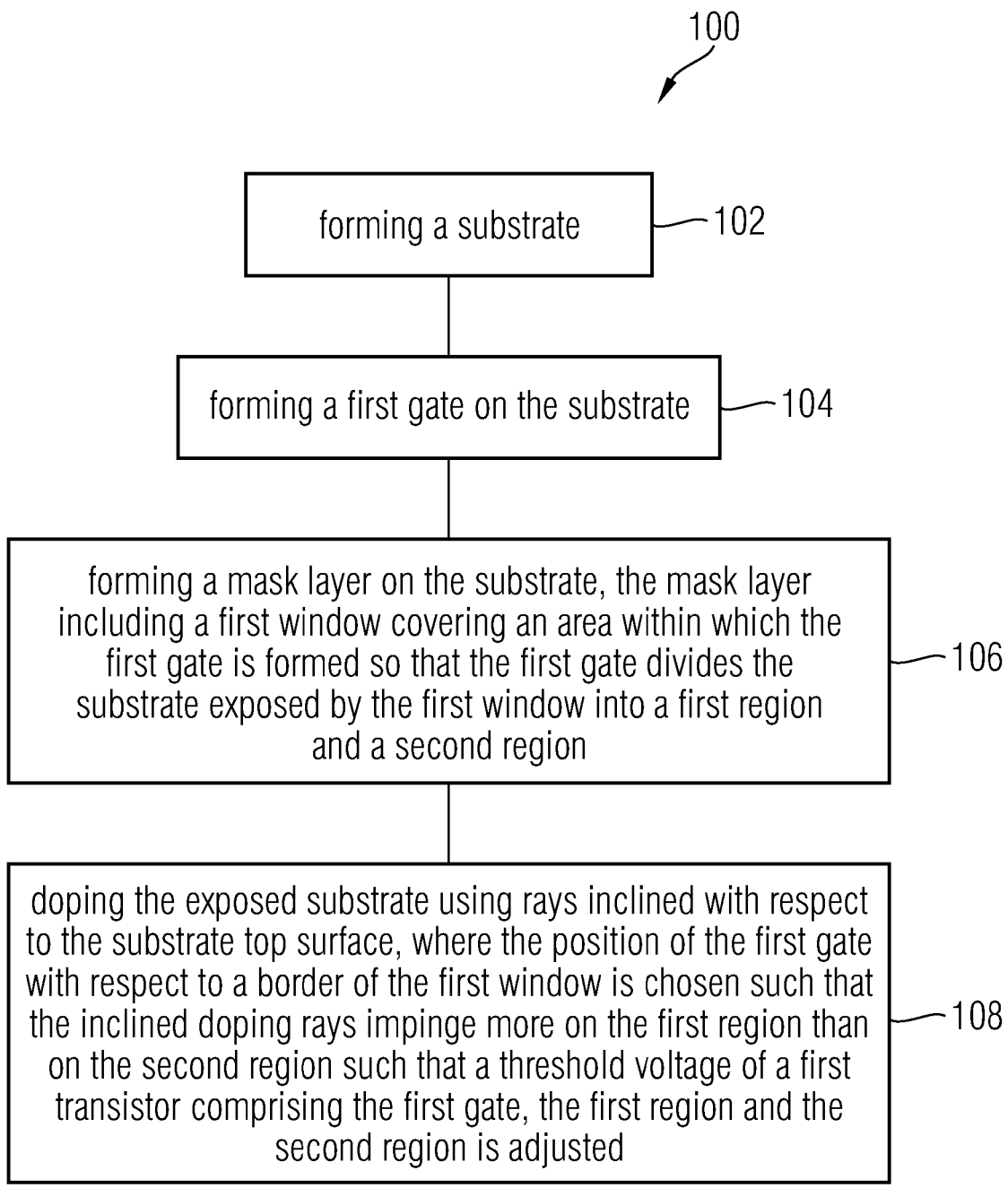
FIG. 1 shows a flowchart of a method of fabricating a semiconductor device according to one embodiment of the present invention.

FIG. 1 shows a flowchart 100 of a method used to fabricate a semiconductor device according to one embodiment of the present invention.

At 102, a substrate is formed. At 104, a first gate is formed on the substrate. At 106, a mask layer is formed on the substrate. The mask layer includes a first window covering an area within which the first gate is formed, so that the first gate divides the substrate exposed by the first window into a first region and a second region. At 108, the exposed substrate is doped using rays inclined with respect to the substrate top surface, wherein the position of the first gate with respect to a border of the first window is chosen such that the inclined doping rays impinge more on the first region than on the second region such that a threshold voltage of a first transistor having the first gate, the first region and the second region is adjusted.

Figure 2:
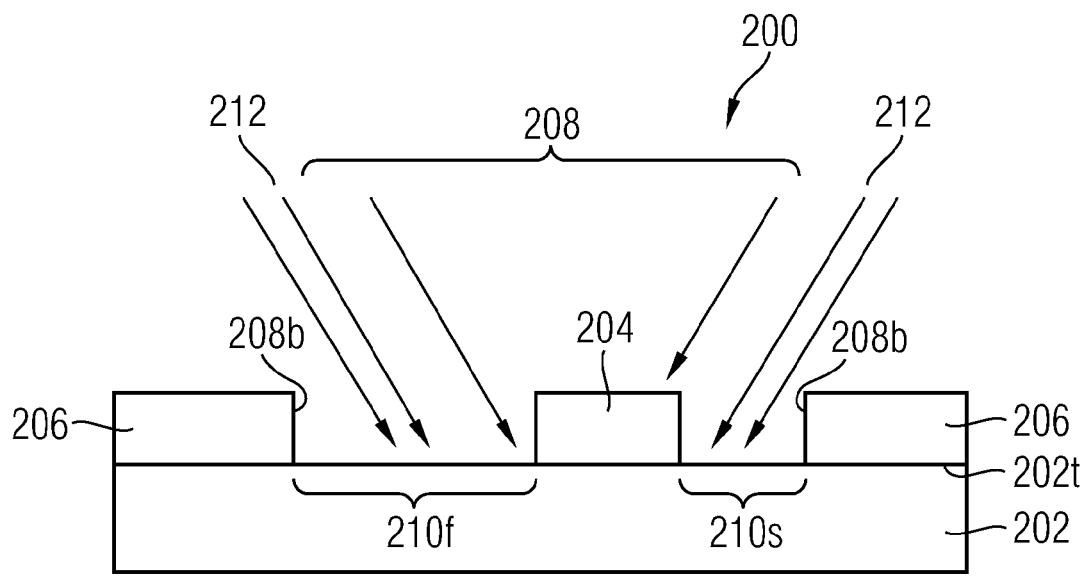
FIG. 2 shows one stage of a method of fabricating a semiconductor device according to one embodiment of the present invention.

FIG. 2 shows one stage of a method or fabrication process used to fabricate a semiconductor device 200 according to one embodiment of the present invention. The fabrication process includes forming a substrate 202 and forming a first gate 204 on the substrate 202. The fabrication process also includes forming a mask layer 206 on the substrate 202. The mask layer 206 includes a first window 208 covering an area within which the first gate 204 is formed. The first gate 204 divides the substrate 202 exposed by the first window 208 into a first region 210f and a second region 210s. The exposed substrate is doped using rays 212 inclined with respect to the substrate top surface 202t. The position of the first gate 204 with respect to a border 208b of the first window 208 is chosen such that the inclined doping rays 212 impinge more on the first region 210f than on the second region 210s such that a threshold voltage of a first transistor (see reference numeral 350 in FIG. 3H) having the first gate 204, the first region 210f and the second region 210s is adjusted.

FIGS. 3A to 3H show fabrication stages when fabricating a semiconductor device 300 according to an embodiment of the present invention.

Figure 3A:
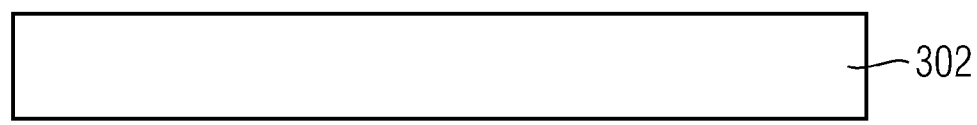
FIGS. 3A to 3H show fabrication processes of a method of fabricating a semiconductor device according to an embodiment of the present invention.

The fabrication process begins in FIG. 3A by forming a substrate 302.

According to one embodiment of the present invention, the formation process of the substrate 302 includes implanting n-well or p-wells with two different masks, one for the n-well and one for the p-well. For the n-well, phosphorus implants with energies ranging from 200 keV up to 500 keV and doses ranging from 1e13 cm^-2 to 5e13 cm^-2 may be used. For the p-well, boron implants with energies ranging from 100 keV to 200 keV and doses from 1e13 cm^-2 to 5e13 cm^-2 may be used. The well profiles may be retrograde, that means the maximum doping concentration is not at the top surface of the substrate 302, but at a depth of about 400 nm to 600 nm. The surface concentration may be in the range of 1e16 cm^-3 to 1e17 cm^-3.

Figure 3B:
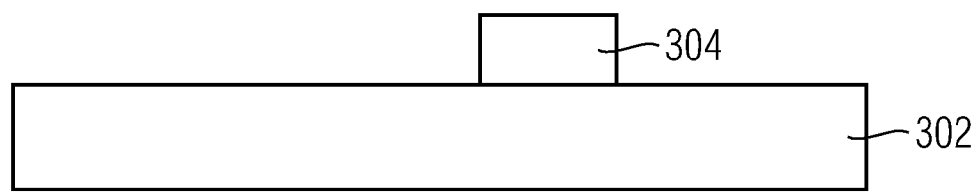

In FIG. 3B, a first gate 304 is formed on the substrate 302.

Figure 3C:
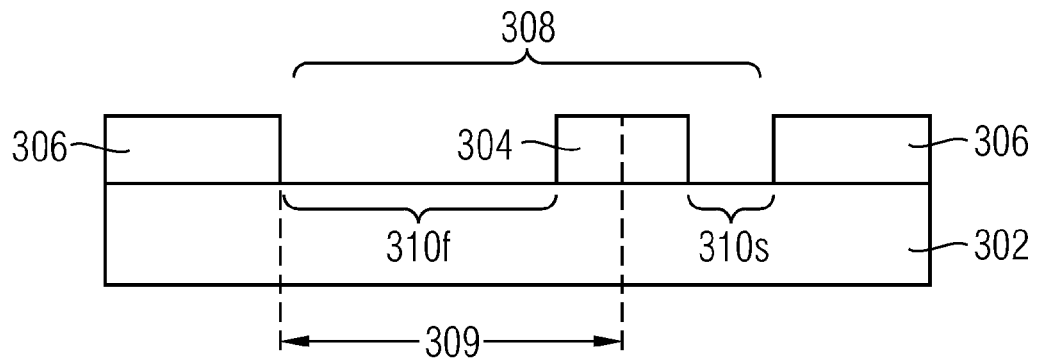

In FIG. 3C, a mask layer 306 (also known as a resist mask) is formed on the substrate 302. The mask layer 306 includes a first window 308 covering an area of the substrate 302 within which the first gate 304 is formed, wherein the first gate 304 divides the area of the substrate 302 covered by the first window 308 into a first region 310f and a second region 310s. In this manner, the first gate 304 and the resist mask/mask layer 306 define implant areas (the exposed areas of the substrate 302).

Figure 3D:
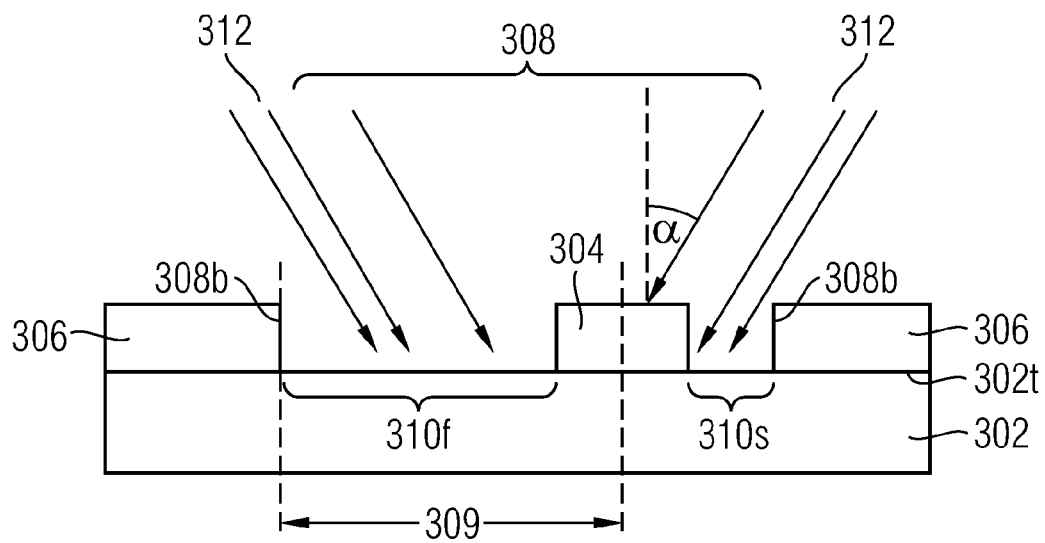

In FIG. 3D, the exposed substrate is doped using rays 312 inclined with respect to the substrate top surface 302t. From FIGS. 3C and 3D, it will be appreciated that the position of the first gate 304 with respect to a border 308b of the first window 308, is chosen such that the inclined doping rays 312 impinge more on the first region 310f than on the second region 310s (achieved by making the width of the second region 310s smaller than the width of the first region 310f). This achieves adjustment of a threshold voltage of a first transistor 350 (see FIG. 3H), eventually formed by the fabrication process of FIGS. 3A to 3H, the first transistor 350 having the first gate 304, the first region 310f and the second region 210s.

Here, the inclined doping rays 312 are halo implant doping rays, i.e. the inclined doping rays 312 are simultaneously used for adjusting the threshold voltage of the first transistor 350 and carrying out a halo implant process. The doses of the inclined doping rays 312 may for example range between 1e13cm^-3 and 1e14 cm^-3. The angles of the doping rays 312 may for example range from about 30 to about 45 degrees.

When manufacturing transistors having a short channel length (e.g. 40 nm in C45), usually a tilted (declined) halo implant is carried out in order to increase the net-doping in the channel due to the overlapping of the halo implants 312. The smaller the channel length, the stronger is the overlapping and the higher is consequently the net-doping. This counteracts the decreasing threshold voltage with decreasing channel length due to drain induced barrier lowering. Thus, in the context of FIG. 3D, by blocking the halo implant (i.e. by blocking the inclined doping rays 312 impinging on the second region 310s of the substrate 302), less peaking occurs in the doping concentration profile of the channel region beneath the gate 304 of the first transistor 350 (see FIG. 3H) to achieve a lower threshold voltage. That is, in comparison with existing fabrication processes that also use Halo implantation, the fabrication process shown in FIGS. 3C and 3D uses the halo implantation both for short channel control and for determining the threshold voltage of the transistor to be formed.

Choosing the position of the first gate 304 with respect to the first window border 308b includes choosing a first distance 309 between the centre of the first gate 304 and the first window border 308b. In the fabrication step shown in FIG. 3C, as the first gate 304 is already deposited on the substrate 302, the first distance 309 is chosen or determined by adjusting the position in which the mask layer 306 is formed on the substrate 302. By adjusting the position of the mask layer 306, shadowing of the inclined doping rays 312 occurs, where in FIG. 3D, more shadowing occurs for the inclined doping rays 312 that are impinging on the second region 310s of the substrate 302. Thus in comparison, the inclined doping rays 312 will impinge more on the first region 310f than on the second region 310s. It will be appreciated that the fabrication process shown in FIG. 3C may be modified so that the first distance 309 is chosen or determined by adjusting the position in which the first gate 304 is formed on the substrate 302.

Figure 3E:
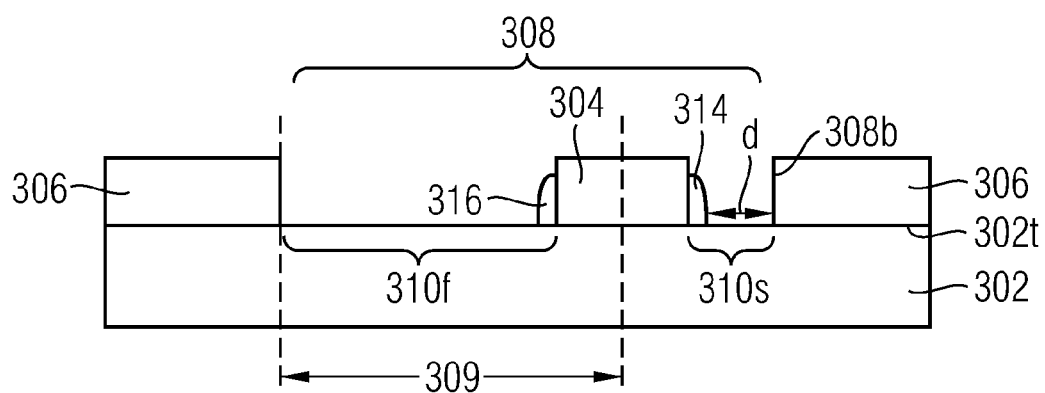

Optionally, before exposing the substrate to inclined doping rays 312 as discussed in conjunction with FIG. 3D, a first side wall spacer 314 covering at least a part of the side wall of the first gate 304 may be formed, as shown in FIG. 3E. The first side wall spacer 314 also covers an exposed portion of the substrate 302. The first side wall spacer 314 provides the advantage of further blocking halo implantation into the second region 310s of the substrate 302. Therefore, the inclined doping rays 312 (see FIG. 3D) impinge more on the first region 310f than on the second region 310s. Further, the first distance 309 and the shape of the first side wall spacer 314 may be chosen such that the inclined doping rays 312 impinge only on the first region 310f. In order to guarantee this, a distance d between a part of the first side wall spacer 314 formed within the second region 310s and a part of the window border 308b facing the first side wall spacer 314 part can be chosen to be less than tan(alpha)*rh, wherein alpha (α, see FIG. 3D) is the acute angle between the inclined doping rays 312 and a normal axis to the substrate top surface 302t, and rh is the thickness of the mask layer 306. Using a C45LP process, suitable numbers for distance d and the width of the first side wall spacer 314 may for example be around 135 nm and around 12 nm, respectively. However, it is to be understood that theses numbers are strongly dependent on the technology used; therefore, the embodiments of the present invention are not limited to these numbers. Subtracting overlay tolerances of around 36 nm, the mask layer 306 should be placed less than 100 nm away from the first gate 304 to block the inclined doping rays 312 (see FIG. 3D). However, the mask layer 306 should leave a sufficient portion of the second region 310s exposed to allow for doping from a subsequent extension implant step (see reference numeral 318 in FIG. 3F) since preventing extension implant into the second region 310s will result in a malfunction of the semiconductor device 300 shown in FIG. 3H, i.e. the device 300 would not work (or not correctly work) when preventing the extension implant into the second region 310s. According to one embodiment of the present invention, the extension implants are carried out using doping rays which are not declined, i.e. the tilt angle is zero.

As shown in FIG. 3E, a second side wall spacer 316 covering at least a part of the side wall of the first gate 304, opposite to where the first side wall spacer 314 is formed, may also be formed. The second side wall spacer 316 also covers an exposed portion of the substrate 302.

Figure 3F:
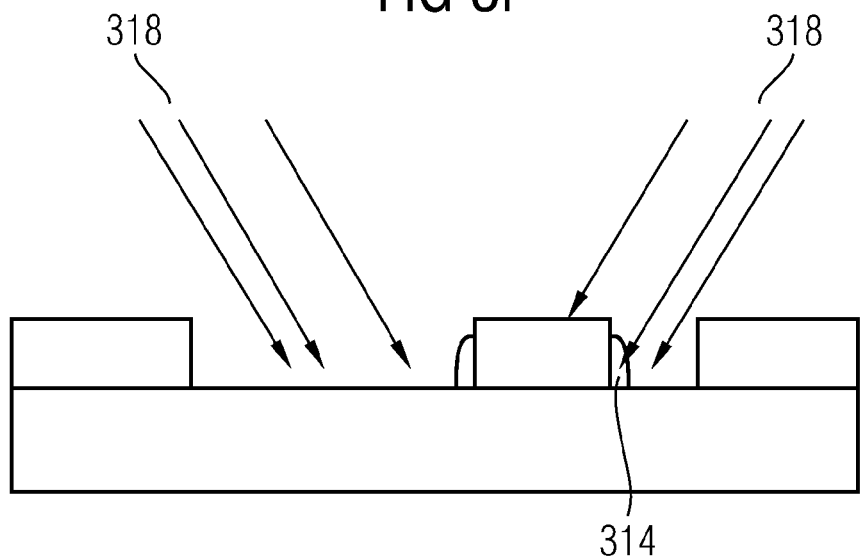
Figure 3G:
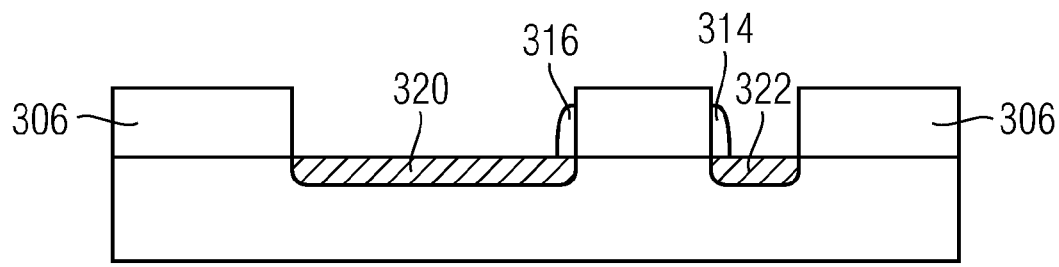

After having carried out the halo implants/extension implants, as shown in FIG. 3F, the first region 310f is doped to form a source region 320, and the second region 310s is doped to form a drain region 322, or vice versa. In order to carry out this, doping rays 318 or a doping gas may be used, thereby reaching the fabrication stage shown in FIG. 3G. For this, the first side wall spacer 314 and the second side wall spacer 316 may be enlarged/replaced by different side wall spacers. According to one embodiment of the present invention, the source/drain implants are carried out using doping rays which are not declined, i.e. the tilt angle is zero.

Figure 3H:
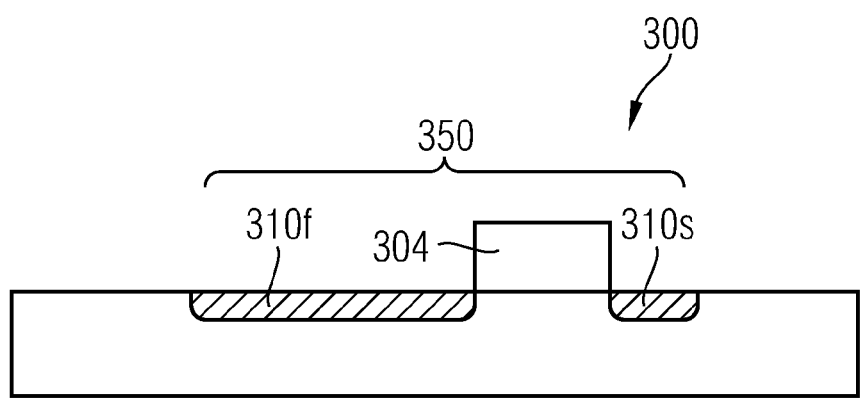

The mask layer 306 and the first side wall spacer 318 (and the second side wall spacer 316, where formed) are then removed to obtain the first transistor 350, as shown in FIG. 3H. The first transistor 350 includes the first gate 304, the first region 310f and the second region 310s.

FIG. 4 shows a flowchart 400 of a method used to fabricate a semiconductor device according to one embodiment of the present invention.

At 402, a substrate is formed. At 404, a first gate is formed on the substrate, while at 406, a second gate is formed on the substrate. At 408, a mask layer is formed on the substrate. The mask layer includes a first window covering an area within which the first gate is formed and a second window covering an area within which the second gate is formed, so that the first gate divides the substrate exposed by the first window into a first region and a second region, while the second gate divides the substrate exposed by the second window into a third region and a fourth region. The areas of the first region, the second region, the third region and the fourth region are different with respect to each other. At 410, the exposed substrate is doped using rays inclined with respect to the substrate surface, where the position of the first gate with respect to a border of the first window is chosen such that the inclined doping rays impinge more on the first region than on the second region, while the position of the second gate with respect to a border of the second window is chosen such that the inclined doping rays impinge more on the third region than on the fourth region. In this manner, a threshold voltage of a first transistor having the first gate, the first region and the second region, is adjusted relative to a threshold voltage of a second transistor having the second gate, the third region and the fourth region.

Figure 5:
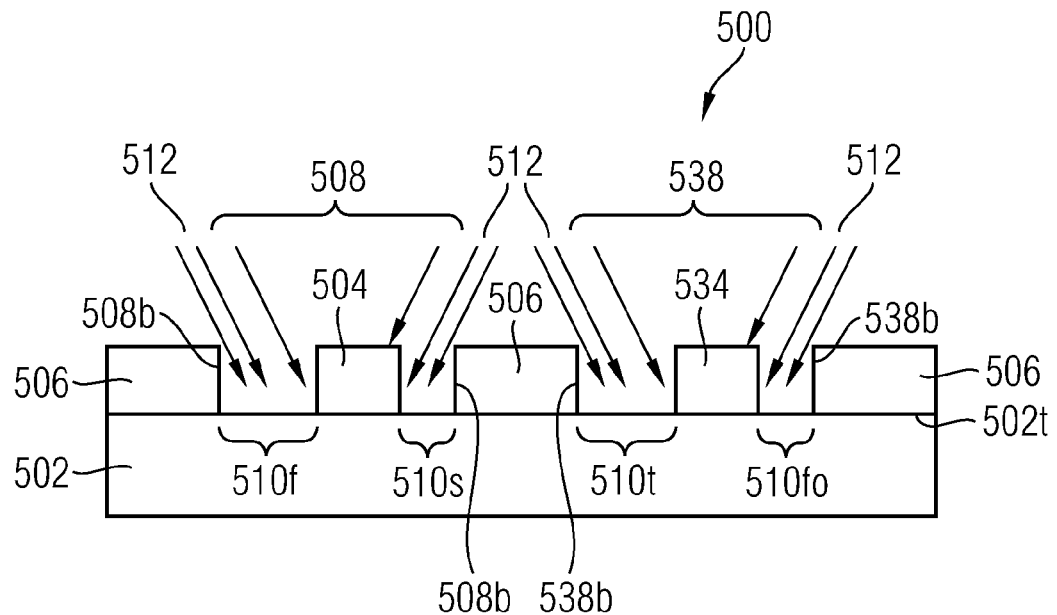
FIG. 5 shows one stage of a method of fabricating a semiconductor device according to one embodiment of the present invention.

FIG. 5 shows one stage of a method or fabrication process used to fabricate a semiconductor device 500 according to one embodiment of the present invention. The fabrication process includes forming a substrate 502, forming a first gate 504 on the substrate 502 and forming a second gate 534 on the substrate 502. The fabrication process also includes forming a mask layer 506 on the substrate 502. The mask layer 506 includes a first window 508 covering an area within which the first gate 504 is formed and a second window 538 covering an area within which the second gate 534 is formed. The first gate 504 divides the substrate 502 exposed by the first window 508 into a first region 510f and a second region 510s. The second gate 534 divides the substrate 502 exposed by the second window 538 into a third region 510t and a fourth region 510fo. The areas of the first region 510f, the second region 510s, the third region S10t and the fourth region 510fo are different with respect to each other. The exposed substrate is doped using rays 512 inclined with respect to the substrate top surface 502t. The position of the first gate 504 with respect to a border 508b of the first window 508 is chosen such that the inclined doping rays 512 impinge more on the first region 510f than on the second region 510s, while the position of the second gate 534 with respect to a border 538b of the second window 538 is chosen such that the inclined doping rays 512 impinge more on the third region 510t than on the fourth region 510fo. In this manner, a threshold voltage of a first transistor (see reference numeral 650 in FIG. 6H) having the first gate 504, the first region 510f and the second region 510s is adjusted relative to a threshold voltage of a second transistor (see reference numeral 680 in FIG. 6H) having the second gate 534, the third region 510t and the fourth region 510fo.

The mask layer 506 is formed as a single mask layer upon the substrate 502. It will be appreciated that the embodiment of the invention shown in FIG. 5 allows, by only using a single mask layer, the fabrication of a semiconductor device having transistors with different threshold voltages. On the other hand, known fabrication processes require more than one mask layer to achieve a semiconductor device with more than one threshold voltage level. For example, a C65LP baseband production uses well implants combined with threshold voltage implants to fabricate a regular threshold voltage level transistor on a semiconductor. Fabricating a high threshold voltage transistor (Nhvt/Phvt) on the same semiconductor needs additional implants with two additional masks, one to form the NMOS device and the other to form the PMOS device. Similarly, forming an additional low threshold transistor on the same semiconductor needs two additional masks. To give an example of a range of values for what is considered a low, a regular and a high threshold voltage: In a typical low power process, threshold voltages of highVth/regularVth/lowVth devices are in the order of 490/370/270 mV. However, the embodiments of the present invention are not limited to these threshold voltages. These additional masks increase the cost of production.

FIGS. 6A to 6H show fabrication processes used to fabricate a semiconductor device 600 according to an embodiment of the present invention.

All manufacturing parameters/processing details which have been discussed in the context of the manufacturing process described in FIGS. 3A to 3H may also be applied in an analogue manner to the manufacturing process which will be described in the following making reference to FIGS. 6A to 6H.

Figure 6A:
FIGS. 6A to 6H show fabrication processes of a method of fabricating a semiconductor device according to an embodiment of the present invention.
Figure 6B:
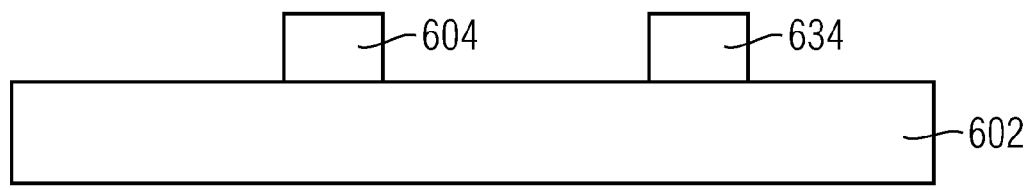

The fabrication process begins in FIG. 6A by forming a substrate 602. In FIG. 6B, a first gate 604 is formed on the substrate 602. In addition, a second gate 634 is formed on the substrate 602.

Figure 6C:
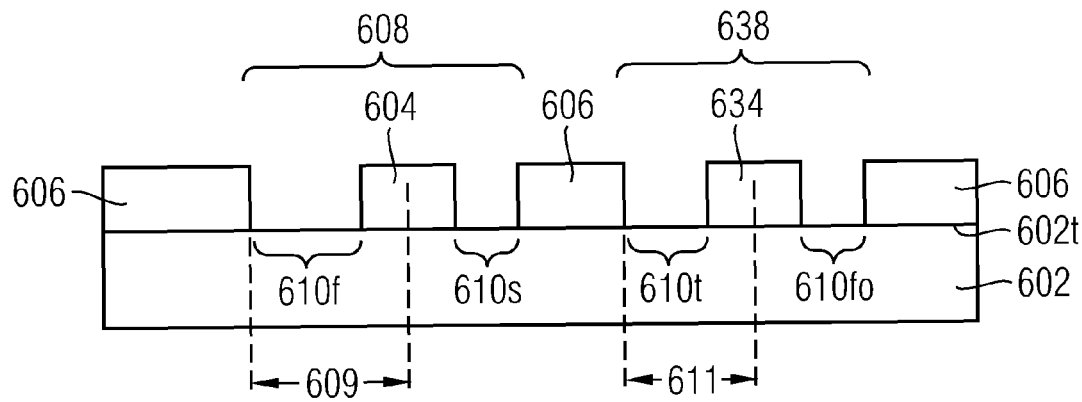

In FIG. 6C, a mask layer 606 (also known as a resist mask) is formed, e.g. by deposition, on the substrate 602. The mask layer 606 is such that it includes a first window 608 covering an area within which the first gate 604 is formed, and includes a second window 638 covering an area within which the second gate 634 is formed. The first gate 604 divides the area of the substrate 602 exposed by the first window 608 into a first region 610f and a second region 610s. The second gate 634 divides the area of the substrate 602 exposed by the second window 638 into a third region 610t and a fourth region 610fo. The areas of the first region 610f, the second region 610s, the third region 610t and the fourth region 610fo are different with respect to each other. In this manner, the first gate 604, the second gate 634 and the resist mask/mask layer 606 define areas for implant into the exposed areas of the substrate 602.

Figure 6D:
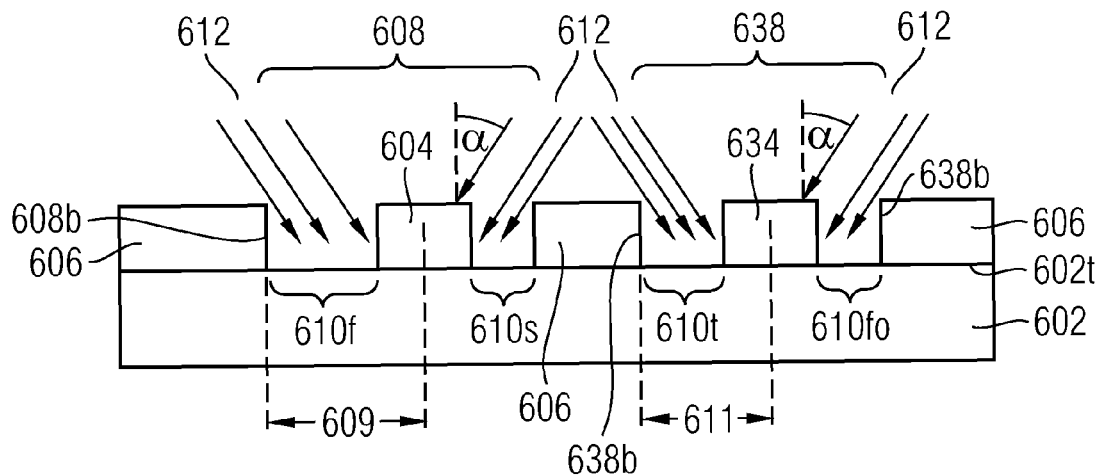

In FIG. 6D, the exposed substrate areas are doped using rays 612 inclined with respect to the substrate top surface 602t. From FIGS. 6C and 6D, it will be appreciated that the position of the first gate 604 with respect to a border 608b of the first window 608, can be chosen such that the inclined doping rays 612 impinge more on the first region 610f than on the second region 610s (achieved by making the width of the second region 610s smaller than the width of the first region 610f). Similarly, the position of the second gate 634 with respect to a border 638b of the second window 638, can be chosen such that the inclined doping rays 612 impinge more on the third region 610t than on the fourth region 610fo (achieved by making the width of the fourth region 610fo smaller than the width of the third region 610t). This achieves adjusting a threshold voltage of a first transistor (see reference numeral 650 in FIG. 6H) having the first gate 604, the first region 610f and the second region 610s relative to a threshold voltage of a second transistor (see reference numeral 680 in FIG. 6H) having the second gate 634, the third region 610t and the fourth region 610fo.

The mask layer 606 is disposed as a single mask layer upon the substrate 602. It will be appreciated that the process shown in FIGS. 6A to 6H allows, by only using a single mask layer, the fabrication of a semiconductor device having transistors with different threshold voltages. On the other hand, known fabrication processes require more than one mask layer to achieve a semiconductor device with more than one threshold voltage level.

Here, the inclined doping rays 612 are simultaneously used for adjusting the threshold value and for carrying out a halo implant process. When manufacturing transistors having a short channel length (e.g. 40 nm in C45), usually a tilted (declined) halo implant is carried out in order to increase the net-doping in the channel due to the overlapping of the halo implants 612. The smaller the channel length, the stronger is the the overlapping and the higher is consequently the net-doping. This counteracts the decreasing threshold voltage with decreasing channel length due to drain induced barrier lowering. Thus, in the context of FIG. 6D, by blocking the halo implant (i.e. by blocking the inclined doping rays 612 impinging on the second region 610s of the substrate 602), less peaking occurs in the doping concentration profile of the channel region beneath the first gate 604 of the first transistor 650 (see FIG. 6H) to achieve a lower threshold voltage. Similarly, by blocking halo implant (i.e. by blocking the inclined doping rays 612 impinging on the fourth region 610fo of the substrate 602), less peaking occurs in the doping concentration profile of the channel region beneath the second gate 634 of the second transistor 680 (see FIG. 6H) to achieve a lower threshold voltage. That is, in comparison with existing fabrication processes that also use halo implantation, the fabrication process shown in FIGS. 6C and 6D uses the halo implantation both for short channel control and for determining the threshold voltage of the transistor to be formed.

Choosing the position of the first gate 604 with respect to the first window border 608b includes choosing a first distance 609 between the centre of the first gate 604 and the first window border 608b. Similarly, choosing the position of the second gate 634 with respect to the second window border 638b comprises choosing a second distance 611 between the centre of the second gate 634 and the second window border 638b. In the fabrication step shown in FIG. 6C, as the first gate 604 is already formed on the substrate 602, the first distance 609 is chosen or determined by adjusting the position in which the mask layer 606 is formed on the substrate 602. Similarly, as the second gate 634 is already deposited on the substrate 602, the second distance 611 is chosen or determined by adjusting the position in which the mask layer 606 is formed on the substrate 602. By adjusting the position of the mask layer 606, shadowing of the inclined doping rays 612 occurs, where in FIG. 6D, more shadowing occurs for the inclined doping rays 612 that are impinging on both the second region 610s and the fourth region 610fo of the substrate 602. Thus in comparison, the inclined doping rays 612 will impinge more on the first region 610f and on the third region 610t than on the second region 610s and the fourth region 610fo respectively. It will be appreciated that the fabrication process shown in FIG. 6C may be modified so that the first distance 609 is chosen or determined by adjusting the position in which the first gate 604 is formed on the substrate 602, while the second distance 611 is chosen or determined by adjusting the position in which the second gate 634 is formed on the substrate 602.

Figure 6E:
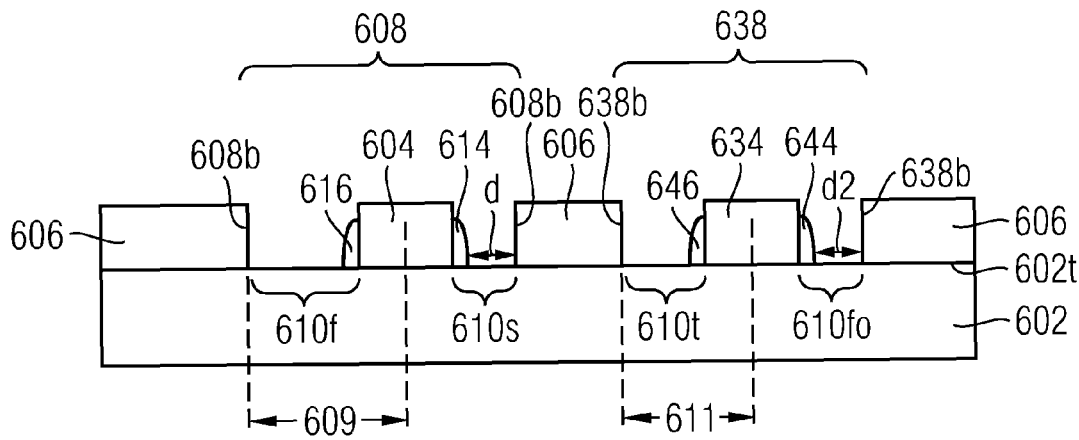

Optionally, before exposing the substrate to inclined doping rays 312 as discussed in conjunction with FIG. 6D, a first side wall spacer 614 covering at least a part of the side wall of the first gate 604 may be formed, as shown in FIG. 6E. The first side wall spacer 614 also covers an exposed portion of the substrate 602. The first side wall spacer 614 provides the advantage of further blocking halo implantation into the second region 610s of the substrate 602. Therefore, the inclined doping rays 612 (see FIG. 6D) impinge more on the first region 610f than on the second region 610s. Similarly, a second side wall spacer 644 covering at least a part of the side wall of the second gate 634 may be formed. A portion of the second side wall spacer 644 also covers an exposed portion of the substrate 602. The second side wall spacer 644 provides the advantage of further blocking halo implantation into the fourth region 610fo of the substrate 602. Therefore, the inclined doping rays 612 (see FIG. 6D) impinge more on the third region 610t than on the fourth region 610fo. Further, the first distance 609, the second distance 611 and the shapes of the first side wall spacer 614 and the second side wall spacer 644 may be chosen such that the inclined doping rays 612 impinge only on the first region 610f and the third region 610t.

A distance d between a part of the first side wall spacer 614 formed within the second region 610s and a part of the window border 608b facing the first side wall spacer 614 part may be chosen to be less than tan(alpha)*rh, wherein alpha ($\alpha$, see FIG. 6D) is the acute angle between the inclined doping rays 612 and a normal axis to the substrate top surface 602t, and rh is the thickness of the mask layer 606. In this way, it can be ensured that no doping rays 612 impinge only onto the first region 610f and the third region 610t. Using a C45LP process, suitable numbers for distance d and the width of the first side wall spacer 614 may for example be around 135 nm and around 12 nm, respectively. However, it is to be understood that theses numbers are strongly dependent on the technology used; therefore, the embodiments of the present invention are not limited to these numbers. Subtracting overlay tolerances of around 36 nm, the mask layer 606 should be placed less than 100 nm away from the first gate 604 to block the inclined doping rays 612 (see FIG. 6D). However, the mask layer 606 should leave a sufficient portion of the second region 610s exposed to allow for doping from a subsequent extension implant step (see reference numeral 618 in FIG. 6F) since preventing extension implant into the second region 610s will result in a mail function of the semiconductor device 600 (shown in FIG. 6H, i.e. the device 300 would not work (or not correctly work) when preventing the extension implant into the second region 310s.

Accordingly, a distance d2 between a part of the second side wall spacer 644 formed within the fourth region 610fo and a part of the window border 638b facing the second side wall spacer 644 part may be chosen to be less than tan(alpha)*rh, wherein alpha ($\alpha$, see FIG. 6D) is the acute angle between the inclined doping rays 612 and a normal axis to the substrate top surface 602t, and rh is the thickness of the mask layer 606. Using a C45LP process, suitable numbers for distance d2 and the width of the second side wall spacer 644 may for example be around 135 nm and around 12 nm, respectively. However, it is to be understood that theses numbers are strongly dependent on the technology used; therefore, the embodiments of the present invention are not limited to these numbers. Subtracting overlay tolerances of around 36 nm, the mask layer 606 should be placed less than 100 nm away from the second gate 634 to block the inclined doping rays 612 (see FIG. 6D). However, the mask layer 606 should leave a sufficient portion of the fourth region 610fo exposed to allow for doping from a subsequent extension implant step (see reference numeral 618 in FIG. 6F) since preventing extension implant into the fourth region 610fo will result in a mail function of the semiconductor device 600 shown in FIG. 6H.

As shown in FIG. 6E, a third side wall spacer 616 covering at least a part of the side wall of the first gate 604, opposite to where the first side wall spacer 614 is formed, may also be formed. The third side wall spacer 616 also covers an exposed portion of the substrate 602. Similarly, a fourth side wall spacer 646 covering at least a part of the side wall of the second gate 634, opposite to where the second side wall spacer 644 is formed, may also be formed. The fourth side wall spacer 646 also covers the exposed portion of the substrate 602.

Figure 6F:
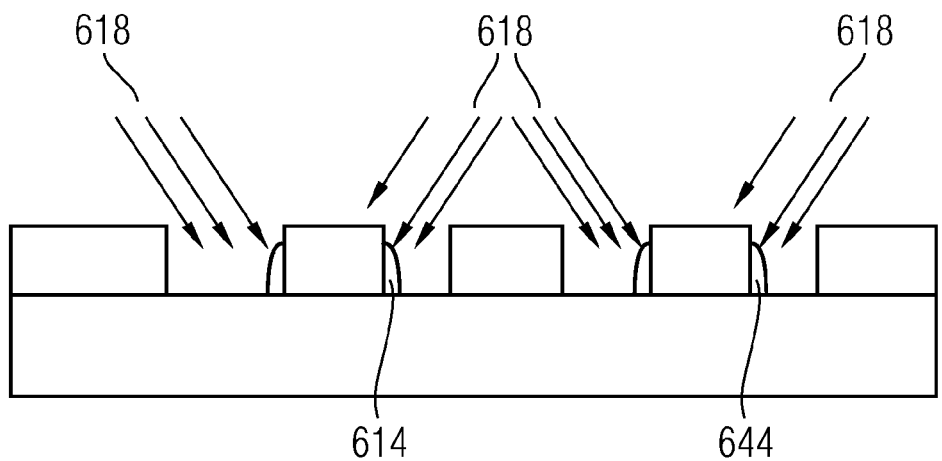
Figure 6G:
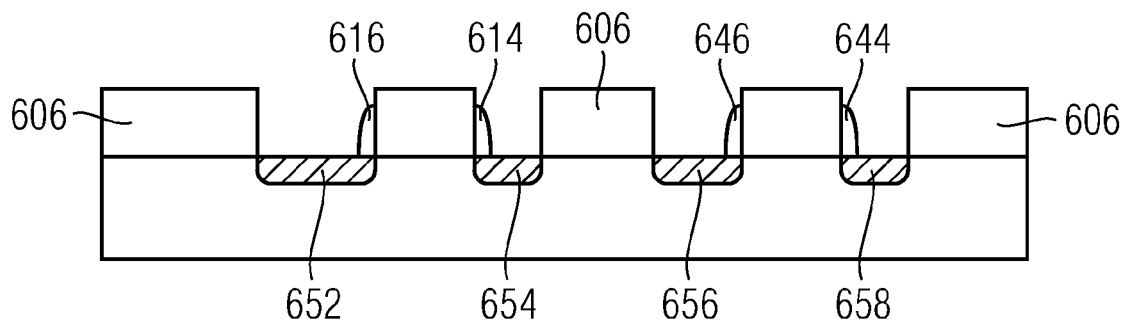

After having carried out the halo implants/extension implants, as shown in FIG. 6F, the first region 610f is doped to form a source region 652; and the second region 610s is doped to form a drain region 654, or vice versa. The third region 610t is doped to form a source region 656; and the fourth region 610fo is doped to form a drain region 658, or vice versa. In order to carry out this, doping rays 618 or a doping gas may be used, thereby reaching the fabrication stage shown in FIG. 6G. For this, the side wall spacers 614, 616, 644 and 646 may be enlarged/replaced by different side wall spacers.

Figure 6H:
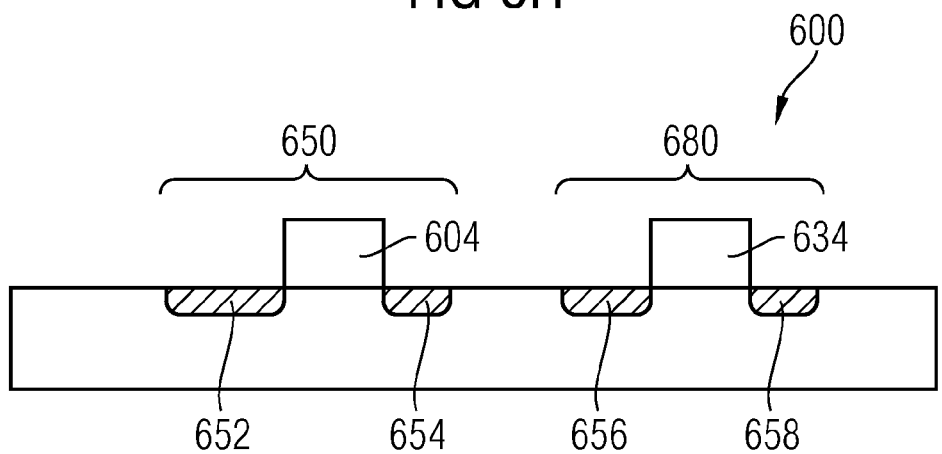

The mask layer 606, the first side wall spacer 614 and the second side wall spacer 644 (along with both the third side wall spacer 616 and the fourth side wall spacer 646, where formed) are then removed to obtain the first transistor 650 and the second transistor 680, as shown in FIG. 6H. The first transistor 650 includes the first gate 604, the first region 610f and the second region 610s. The second transistor 680 includes the second gate 634, the third region 610t and the fourth region 610fo. The threshold voltage of the first transistor 650 is different from the threshold voltage of the second transistor 680.

Figure 7A:
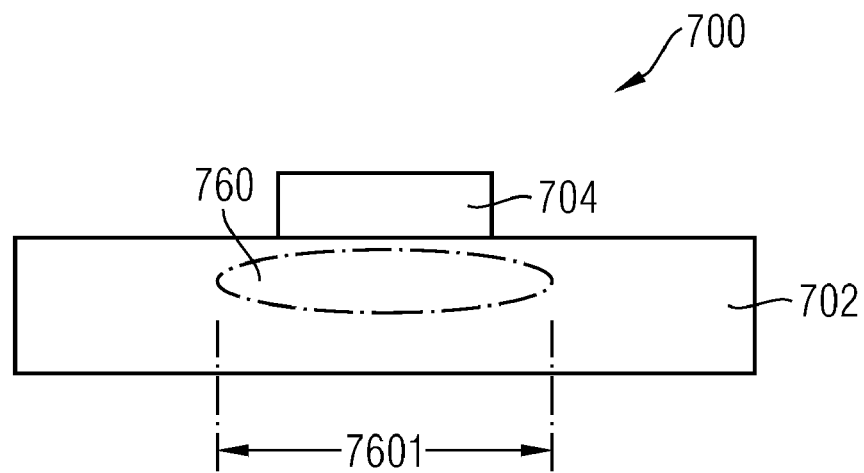
FIG. 7A shows a semiconductor device in accordance with one embodiment of the invention.

FIG. 7A shows a semiconductor device 700 built in accordance with one embodiment of the invention.

The semiconductor device 700 has a substrate 702 and a gate 704 provided on the substrate 702.

It will be appreciated that a channel region 760 will be formed within the substrate 702 below the gate 704, when the semiconductor device 700 is in operation, the channel region 760 spanning the length of the gate 704.

Figure 7B:
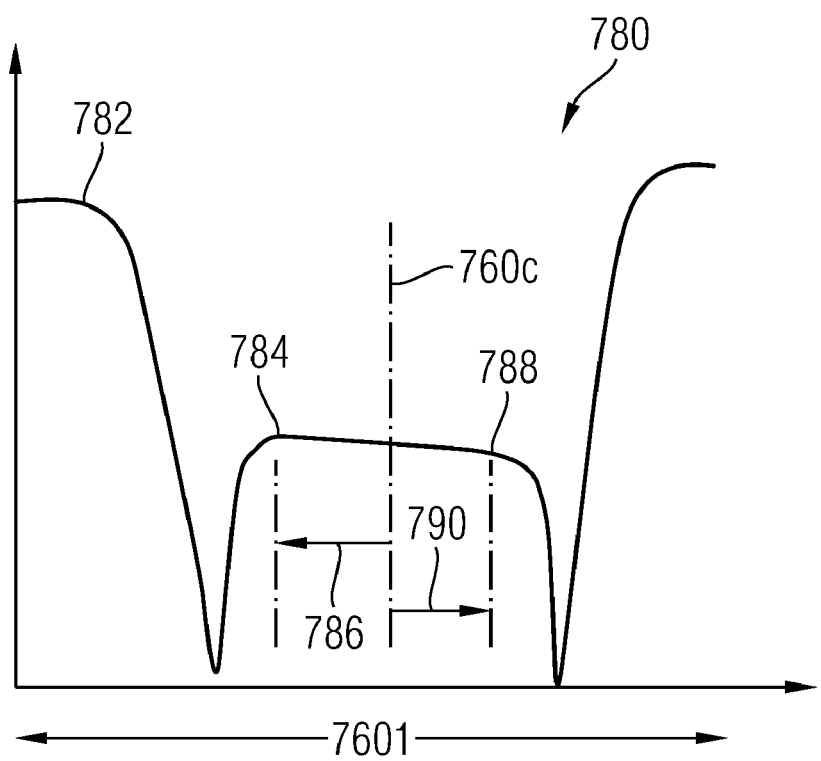
FIG. 7B shows a doping concentration profile of the channel region of the semiconductor device of FIG. 7A in accordance with one embodiment of the invention.

FIG. 7B shows a doping concentration profile 780 for the channel region 760 of the semiconductor device 700 of FIG. 7A. The channel region has an asymmetric arc shaped doping concentration profile 782.

According to one embodiment of the present invention, the length 760l of the channel region 760 is about 100 nm.

The doping concentration profile 782 reaches a highest point 784 at a first distance 786 from around the centre 760c of the channel region 760, and the doping concentration profile 782 decreases to a lower point 788 at a second distance 790 from the centre 760c of the channel region 760, wherein the direction the first distance 786 is spaced from around the centre 760c of the channel region 760 is opposite to the direction the second distance 790 is spaced from around the centre 760c of the channel region 760.

According to one embodiment of the present invention, the first distance 786 and the second distance 790 respectively are about 20 nm.

Example dimensions for the semiconductor device 200, 300, 500, 600 and 700 built in accordance with an embodiment are as follows. The thickness of the mask layers 306, 506 and 606 may be about 150 nm to about 200 nm. The height of the first/second/third/fourth wall spacer 314, 614, 316, 616, 644, and 646 may be about 80 nm to about 1000 nm. The thickness of the first/second/third/fourth wall spacer 314, 614, 316, 616, 644, and 646 may be about 1 to 2 nm.

According to one embodiment of the present invention, a method of forming a semiconductor device is provided. The method may include forming a substrate and forming a first gate on the substrate. A mask layer may be formed on the substrate. The mask layer may include a first window covering an area within which the first gate is formed. The first gate may divide the substrate exposed by the first window into a first region and a second region. The exposed substrate may be doped using rays inclined with respect to the substrate top surface, where the position of the first gate with respect to a border of the first window is chosen such that the inclined doping rays impinge more on the first region than on the second region.

According to one embodiment of the present invention, the doping rays are used to adjust a threshold voltage of a first transistor including the first gate, the first region and the second region.

According to one embodiment of the present invention, the threshold value of the first transistor is adjusted such that a drain current gain voltage curve of the first transistor in a forward biased state is different from a drain current gain voltage curve of the first transistor in a reverse biased state.

According to one embodiment of the present invention, the inclined doping rays are simultaneously used for carrying out a halo implant process.

According to one embodiment of the present invention, choosing the position of the first gate with respect to the first window border includes choosing a first distance between the centre of the first gate and the first window border.

According to one embodiment of the present invention, a first side wall spacer covering at least a part of the side wall of the first gate may be formed.

According to one embodiment of the present invention, the first distance and the shape of the first side wall spacer may be chosen such that the inclined doping rays impinge only on the first region.

According to one embodiment of the present invention, a distance d between a part of the first side wall spacer formed within the second region and a part of the window border facing the first side wall spacer part may be less than tan (alpha)*rh, wherein alpha is the acute angle between the inclined doping rays and a normal axis to the substrate top surface, and rh is the thickness of the mask layer.

According to one embodiment of the present invention, an extension implant may be carried out after having formed the first side wall spacer.

According to one embodiment of the present invention, the doses of the inclined doping rays may range between 1e13 cm^-3 and 1e14 cm^-3.

According to one embodiment of the present invention, after having carried out the extension implant, the following processes may be carried out: doping the first region to form a source region; and doping the second region to form a drain region, or vice versa.

According to one embodiment of the present invention, a method of forming a semiconductor device may be provided.

The method may include: forming a substrate; forming a first gate on the substrate; forming a second gate on the substrate; forming a mask layer on the substrate. The mask layer may include a first window covering an area within which the first gate is formed and a second window covering an area within which the second gate is formed. The first gate may divide the substrate exposed by the first window into a first region and a second region, while the second gate may divide the substrate exposed by the second window into a third region and a fourth region. The areas of the first region, the second region, the third region and the fourth region may be different with respect to each other. The exposed substrate may be doped using rays inclined with respect to the substrate top surface, where the position of the first gate with respect to a border of the first window is chosen such that the inclined doping rays impinge more on the first region than on the second region, while the position of the second gate with respect to a border of the second window is chosen such that the inclined doping rays impinge more on the third region than on the fourth region. In this manner, a threshold voltage of a first transistor including the first gate, the first region and the second region, is adjusted relative to a threshold voltage of a second transistor including the second gate, the third region and the fourth region.

According to one embodiment of the present invention, the inclined doping rays may be simultaneously used for carrying out a halo implant process.

According to one embodiment of the present invention, choosing the position of the first gate with respect to the first window border includes choosing a first distance between the centre of the first gate and the first window border. Choosing the position of the second gate with respect to the second window border includes choosing a second distance between the centre of the second gate and the second window border.

According to one embodiment of the present invention, a first side wall spacer covering at least a part of the side wall of the first gate may be formed. A second side wall spacer covering at least a part of the side wall of the second gate may be formed.

According to one embodiment of the present invention, the first distance, the second distance and the shapes of the first side wall spacer and the second side wall spacer may be chosen such that the inclined doping rays impinge only on the first region and the third region.

According to one embodiment of the present invention, a distance d between a part of the first side wall spacer formed within the second region and a part of the window border facing the first side wall spacer part may be less than tan (alpha)*rh, wherein alpha is the acute angle between the inclined doping rays and a normal axis to the substrate top surface, and rh is the thickness of the mask layer.

According to one embodiment of the present invention, a distance d2 between a part of the second side wall spacer formed within the fourth region and a part of the window border facing the second side wall spacer part may be less than tan(alpha)*rh, wherein alpha is the acute angle between the inclined doping rays and a normal axis to the substrate top surface, and rh is the thickness of the mask layer.

According to one embodiment of the present invention, an extension implant may be carried out after having formed the first side wall spacer and the second side wall spacer.

According to one embodiment of the present invention, doses of the inclined doping rays may range between 1e13 cm^-3 and 1e14 cm^-3. According to one embodiment of the present invention,after having carried out the extension implant, the following processes may be carried out: doping the first region to form a source region; and doping the second region to form a drain region, or vice versa.

According to one embodiment of the present invention, after having carried out the extension implant, the following processes may be carried out: doping the third region to form a source region; and doping the fourth region to form a drain region, or vice versa.

According to one embodiment of the present invention, the method of fabricating the semiconductor device may further include removing the single mask layer, the first side wall spacer and the second side wall spacer, to form the first transistor and the second transistor. The first transistor includes the first gate, the first region and the second region. The second transistor includes the second gate, the third region and the fourth region. The threshold voltage of the first transistor may be different from the threshold voltage of the second transistor.

According to one embodiment of the present invention, a semiconductor device may be provided. The semiconductor may include a substrate and a gate provided on the substrate. A channel region may be formed within in the substrate below the gate, the channel region spanning the length of the gate and having an asymmetric arc shaped doping concentration profile.

According to one embodiment of the present invention, the length of the channel region may be about 100 nm.

According to one embodiment of the present invention, the gate and the channel region are part of a transistor, wherein the asymmetric arc shaped doping profile is chosen such that a drain current gain voltage curve of the transistor in a forward biased state is different from a drain current gain voltage curve of the transistor in a reverse biased state.

Figure 9A:
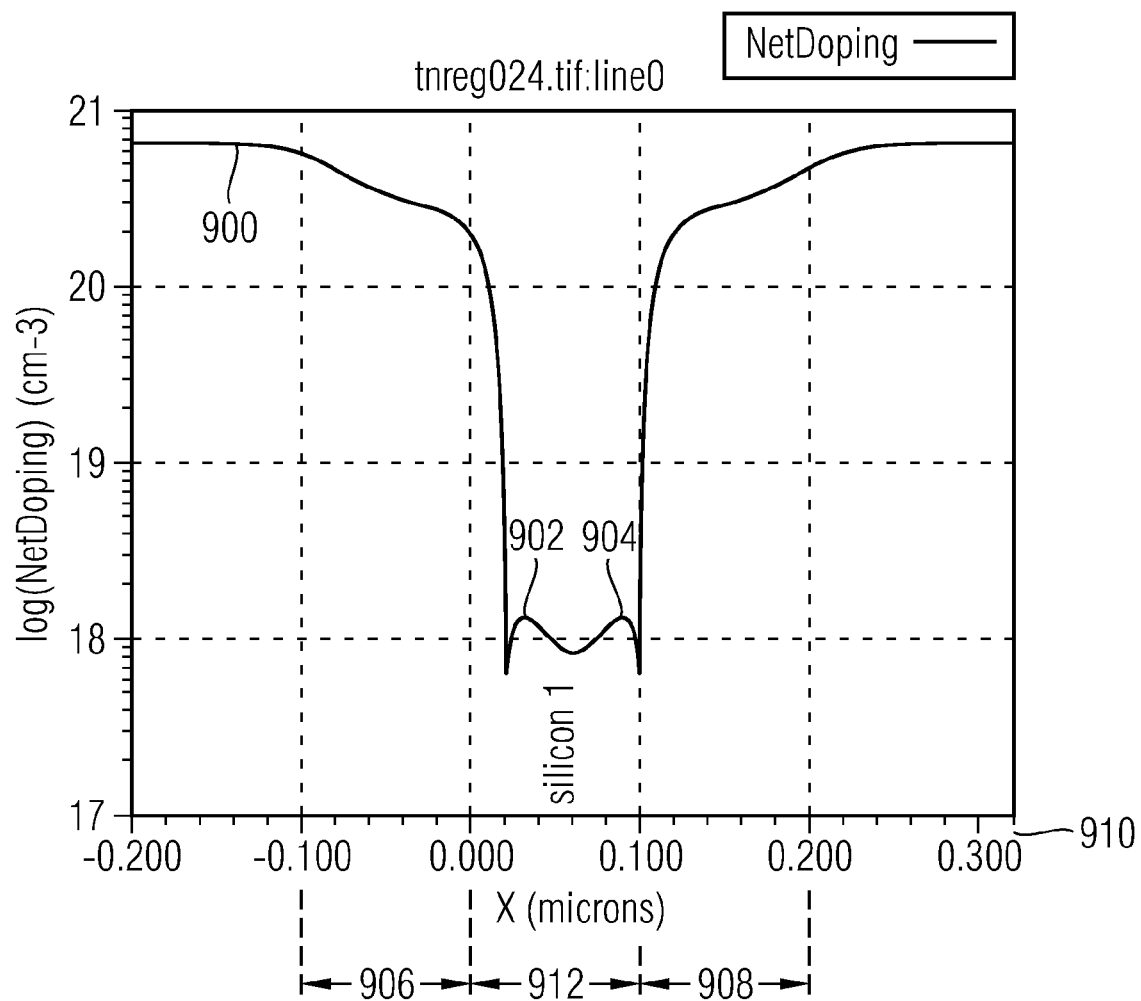
FIGS. 9A and 9B show graphs of doping concentration profiles against the length of substrate of semiconductor devices.
Figure 9B:
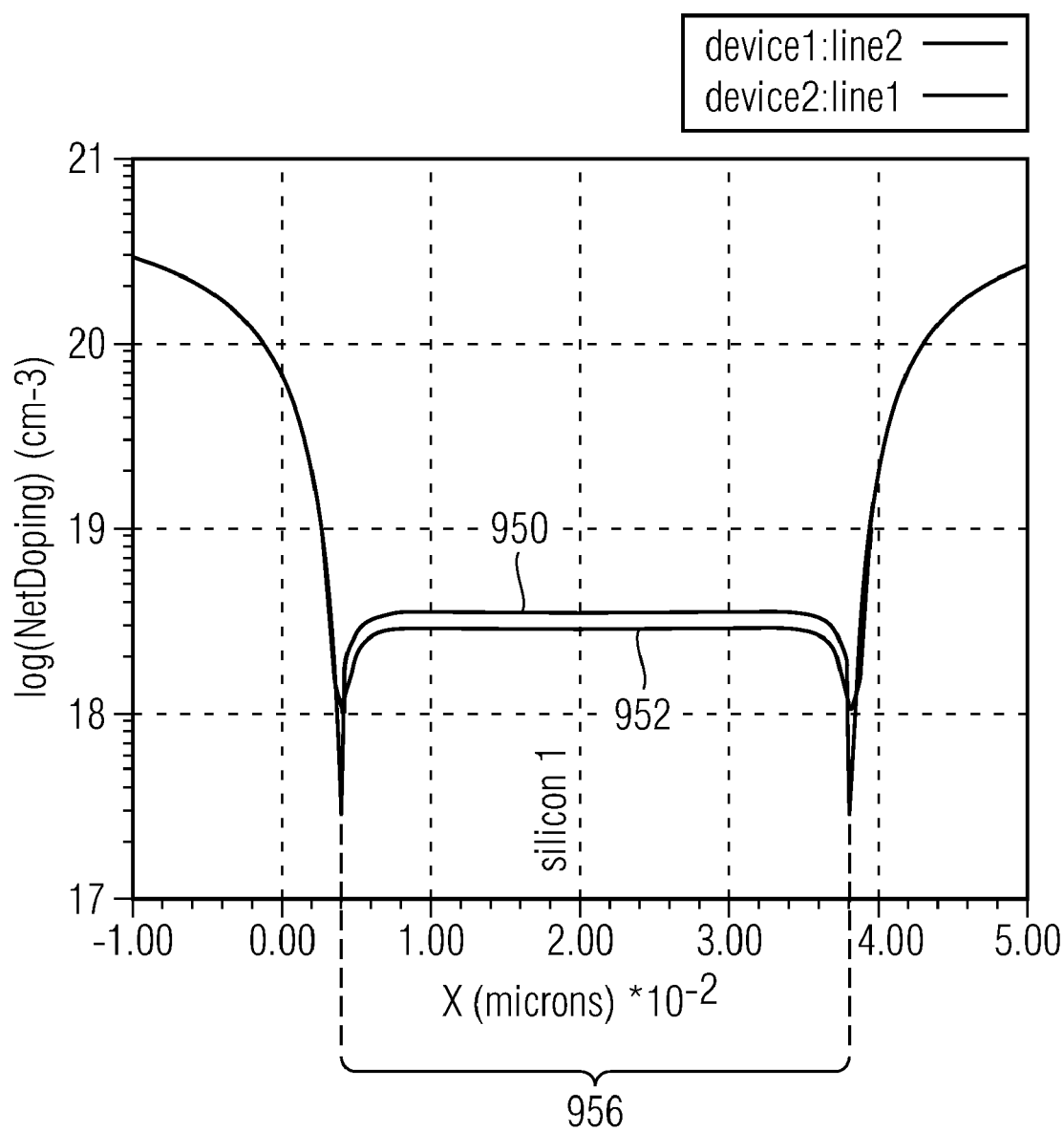

According to one embodiment of the present invention, the doping concentration profile may reach a highest point at a first distance from around the centre of the channel region and the doping concentration profile may decrease to a lower point at a second distance from the centre of the channel region. The direction the first distance is spaced from around the centre of the channel region may be opposite to the direction the second distance is spaced from around the centre of the channel region. FIGS. 9A and 9B show graphs, obtained from performing TCAD simulations, of doping concentration profiles against the length of substrates of semiconductor devices.

FIG. 9A illustrates a cross-sectional view of a concentration profile 900 along a channel of a 130 nm (C11N) NMOS transistor (not shown) with regular Vth (threshold voltage) doping 5 nm below the surface.

The high dose source and drain implants result in doping concentration peaks 902 and 904 of about 6E20/cm$^3$ each. Extension implants are visible between around −0.1 μm and around −0.01 μm (labeled 906) and between around 0.12 μm and around 0.2 μm (labeled 908) of an x-scale 910. The x-scale range 912 between around 0.01 μm to around 0.11 μm shows the doping profile of the channel region below the gate of the 130 nm (C11N) NMOS transistor. The doping concentration in the channel region below the gate is used to adjust the threshold voltage of the 130 nm (C11N) NMOS transistor. The peaks 902 and 904 at the edges of the channel region result from a Halo implant needed for short channel control. The simulation results show that the dopants are not bounded to the channel, but are smeared out.

FIG. 9B illustrates a cross-sectional view of concentration profiles 950 and 952 along the channel of a hvt (high threshold voltage) NMOS transistor (not shown) fabricated using C65LP technology. Doping profile 952 corresponds to a NMOS transistor fabricated without spacer scaling, while doping profile 950 corresponds to a NMOS transistor fabricated with spacer scaling.

The doping profiles 952 and 950 are more "blurred" compared to the doping profile 900 in the sense that it is difficult to distinguish extension implants from source and drain formation implants in the doping profiles 952 and 950. Further, in the channel region 956, there is little distinction between Halo implantation and well implantation. This is due to the reduced geometrical dimension of the channel length formed for the NMOS transistor fabricated using C65LP technology, which is around half of the channel length for the NMOS transistor fabricated using C11N technology, and from diffusion of the implanted species.

Thus, comparing FIGS. 9A and 9B, it will be appreciated that Halo implantation, in more recent technologies (such as C45 and beyond), determines the threshold voltage of fabricated transistors more than in older technologies.

Figure 10:
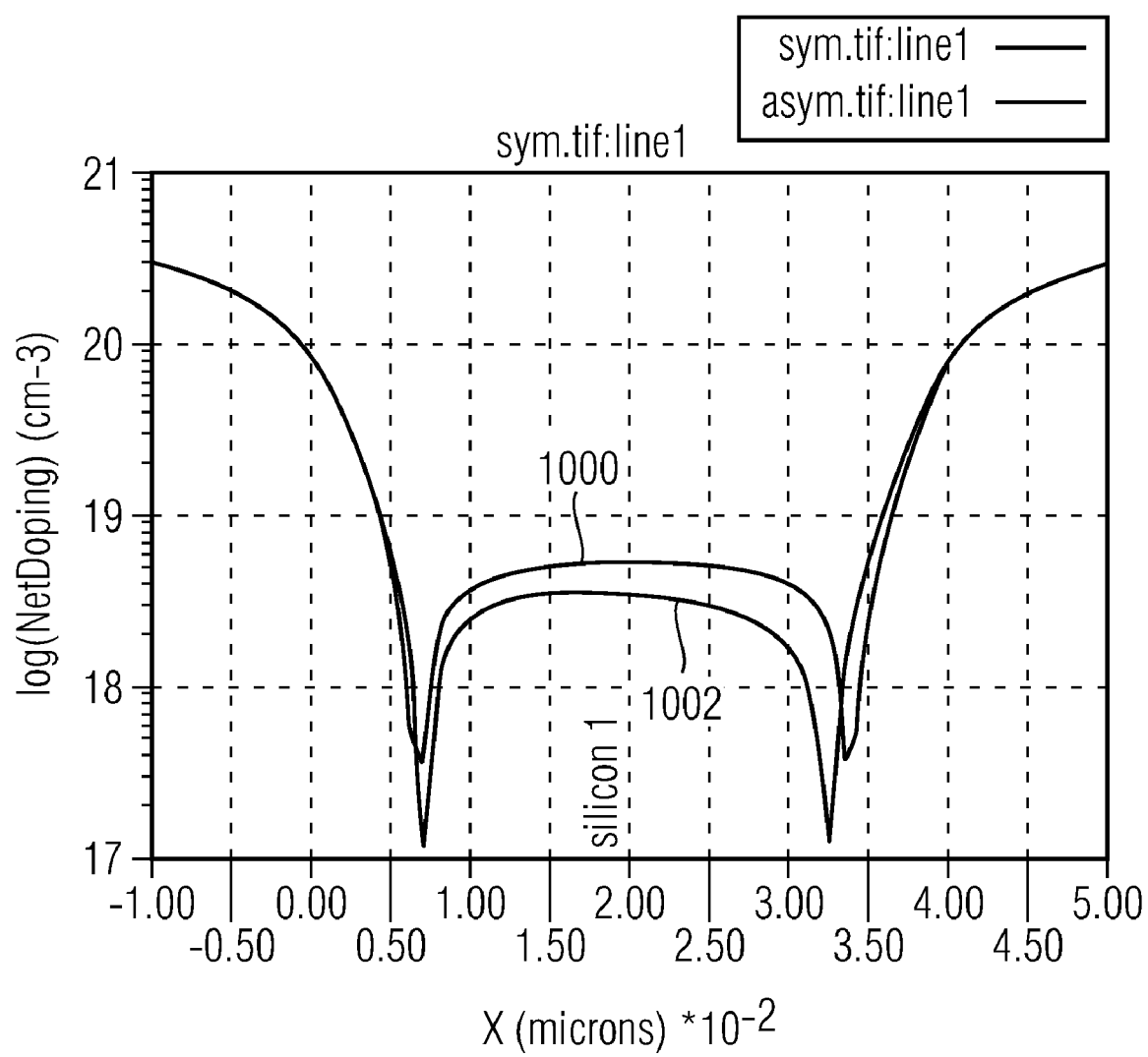
FIG. 10 shows a graph of a doping concentration profile against the length of substrate of a semiconductor device according to one embodiment of the present invention.

FIG. 10 shows a graph, obtained from performing TCAD simulations, of doping concentration profiles 1000 and 1002 against the length of substrates for semiconductor devices.

Doping profile 1000 corresponds to a NMOS transistor fabricated without Halo implant blocking, while doping profile 1002 corresponds to a NMOS transistor fabricated in accordance with one embodiment of the invention.

The doping profile 1000 is generally symmetrical. On the other hand, blocking halo implant on one side of a semiconductor device results in the NMOS transistor with an asymmetric doping concentration profile 1002. Doping of the substrate below the gate is reduced for the NMOS transistor with the doping concentration profile 1002.

A reduction of the doping concentration from around $5E18/cm^3$ to around $3E18/cm^3$ results in a lower threshold voltage, Vth. It will be appreciated that the exact amount of doping and Vth shift depends on the dose balance between well and Halo implant.

Having an asymmetric doping concentration profile 1002 results in different electrical characteristics when the transistor is measured with different forward and backward polarities.

Figure 11A:
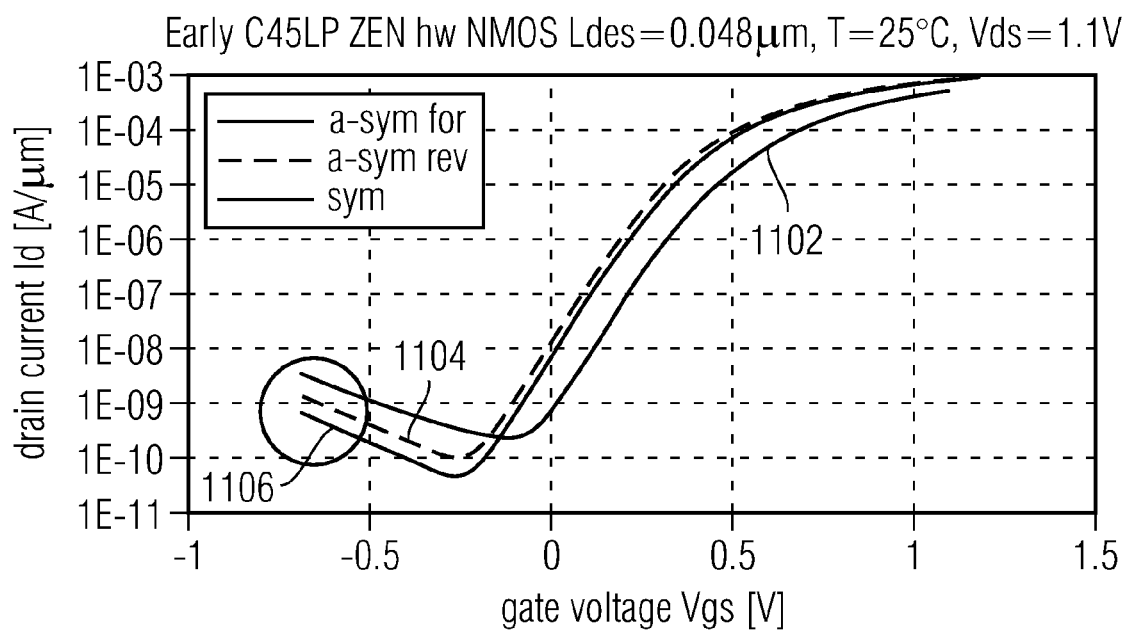
FIG. 11A shows a plot of drain current versus gate voltage of a semiconductor device according to one embodiment of the present invention.
Figure 11B:
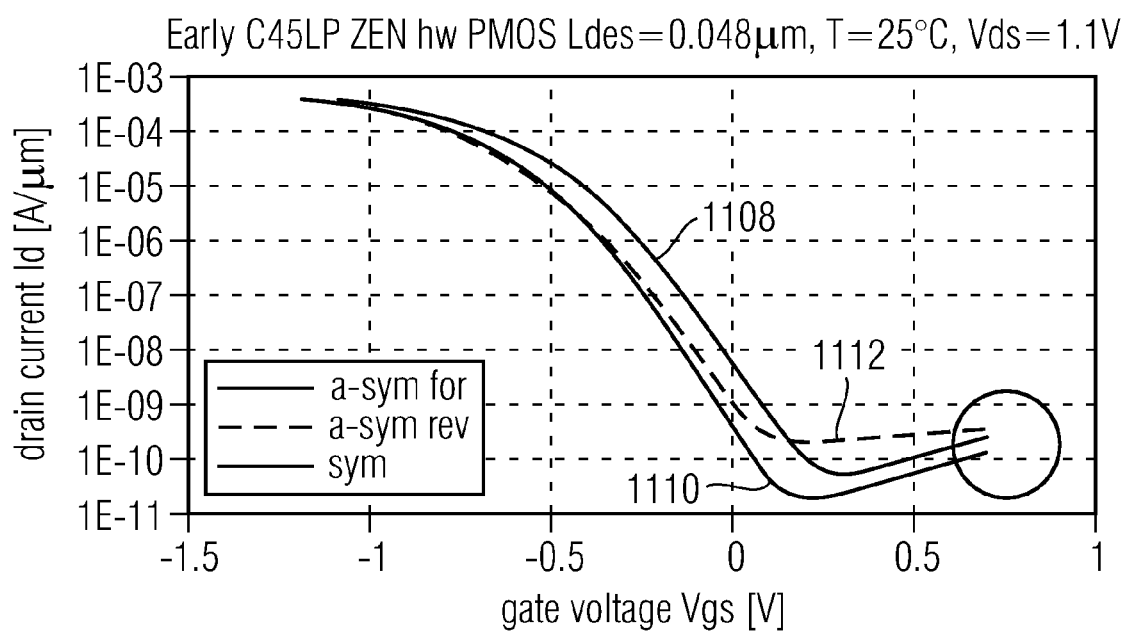
FIG. 11B shows a plot of drain current versus gate voltage of a semiconductor device according to one embodiment of the present invention.

FIG. 11A shows a plot of drain current versus gate voltage for NMOS transistors, while FIG. 11B shows a plot of drain current versus against gate voltage for PMOS transistors.

Turning to FIG. 11A, the NMOS transistor with a symmetric doping concentration profile follows the same drain current-gate voltage curve 1102 when the NMOS transistor is forward or reverse biased. On the other hand, the NMOS transistor with an asymmetric doping concentration profile follows a drain current-gate voltage curve 1106 that is different from the drain current-gate voltage curve 1104 when the NMOS transistor is respectively forward and reverse biased. Also, the NMOS transistor with the symmetric doping concentration profile has a threshold voltage that is about 120 mV higher than the NMOS transistor with an asymmetric doping concentration profile.

Turning to FIG. 11B, the PMOS transistor with a symmetric doping concentration profile follows the same drain current-gate voltage curve 1108 when the PMOS transistor is forward or reverse biased. On the other hand, the PMOS transistor with an asymmetric doping concentration profile follows a drain current-gate voltage curve 1110 that is different from the drain current-gate voltage curve 1112 when the PMOS transistor is respectively forward and reverse biased. It can also be observed that the drain current-gate voltage curves 1110 and 1112 for the PMOS transistor with the asymmetric doping concentration profile exhibit more asymmetry than the drain current-gate voltage curves 1104 and 1106 for the NMOS transistor with the asymmetric doping concentration profile.

The results shown in FIGS. 11A and 11B may be due to As being used as the Halo PMOS implant species, which is less diffusive. The PMOS transistor with the symmetric doping concentration profile (i.e. without Halo blocking) shows a lower threshold voltage than the PMOS transistor with the asymmetric doping concentration profile. The threshold voltage of the symmetric device (symmetric doping concentration profile) is much higher than expected. The asymmetric device (asymmetric doping concentration profile) looks as expected. However, the above simulation results still show that shadowing or blocking Halo implant is a feasible method to reduce the threshold voltage.

Figure 12:
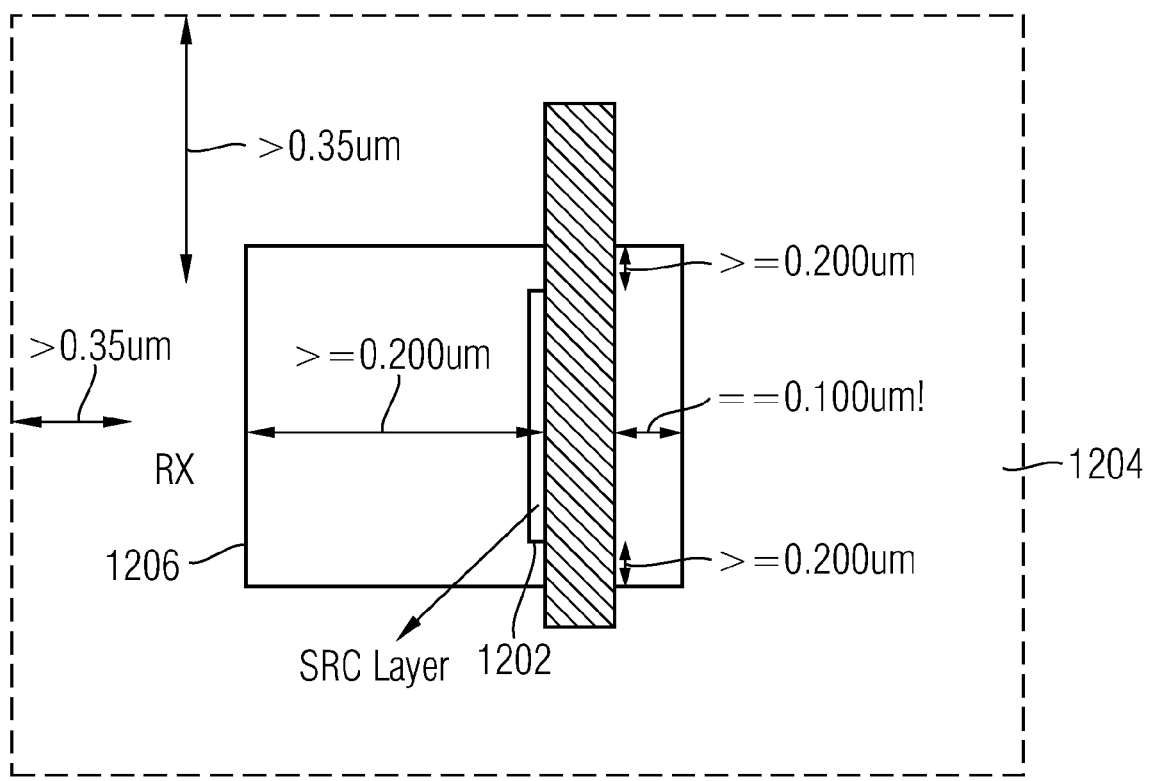
FIG. 12 shows a manufacturing stage of a method of manufacturing a semiconductor device according to one embodiment of the present invention (a C45LP process on a Zen testsite)

FIG. 12 shows implementation of an embodiment of the invention in a C45LP process on a Zen testsite, as simulated in a CAD system.

From FIG. 12, it will be observed that five GDS layers may be required to fabricate a semiconductor device where Halo implantation is blocked on the drain portion of the transistor. The five layers are a marking layer 1202 for forming the source region, two marking layers for creating the mask 1204 and two openings for the halo mask 1206. These five layers may be implemented at the stage of preparing data for the gdsII mask file.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a semiconductor device, the method comprising:
   forming a substrate;
   forming a first gate on the substrate;
   forming a mask layer on the substrate, the mask layer comprising a first window covering an area within which the first gate is formed so that the first gate divides the substrate exposed by the first window into a first region and a second region; and
   doping the exposed substrate using rays inclined with respect to the substrate top surface, wherein the position of the first gate with respect to a border of the first window is chosen such that the inclined doping rays impinge more on the first region than on the second region.

2. The method according to claim 1,
   wherein the doping rays are used in order to adjust a threshold voltage of a first transistor comprising the first gate, the first region and the second region.

3. The method of claim 2,
   wherein the threshold value of the first transistor is adjusted such that a drain current gain voltage curve of the first transistor in a forward biased state is different from a drain current gain voltage curve of the first transistor in a reverse biased state.

4. The method of claim 2,
   wherein the inclined doping rays are simultaneously used for carrying out a halo implant process.

5. The method of claim 4,
   wherein choosing the position of the first gate with respect to the first window border comprises choosing a first distance between the centre of the first gate and the first window border.

6. The method of claim 5,
wherein a first side wall spacer covering at least a part of the side wall of the first gate is formed.

7. The method of claim 6,
wherein the first distance and the shape of the first side wall spacer are chosen such that the inclined doping rays impinge only on the first region.

8. The method of claim 7,
wherein a distance d between a part of the first side wall spacer formed within the second region and a part of the window border facing the first side wall spacer part is less than tan(alpha)*rh, wherein alpha is the acute angle between the inclined doping rays and a normal axis to the substrate top surface, and rh is the thickness of the mask layer.

9. The method of claim 8,
wherein an extension implant is carried out after having formed the first side wall spacer.

10. The method of claim 4,
wherein the doses of the inclined doping rays range between 1e13 cm^-3 and 1e14 cm^-3.

11. The method of claim 4,
wherein the angle of the inclined doping rays ranges between 30 and 45 degrees.

12. The method of claim 9,
wherein, after having carried out the extension implant, the following processes are carried out:
doping the first region to form a source region; and
doping the second region to form a drain region, or vice versa.

13. A method of forming a semiconductor device, the method comprising:
forming a substrate;
forming a first gate on the substrate;
forming a second gate on the substrate;
forming a mask layer on the substrate, the mask layer comprising a first window covering an area within which the first gate is formed and a second window covering an area within which the second gate is formed, so that the first gate divides the substrate exposed by the first window into a first region and a second region, while the second gate divides the substrate exposed by the second window into a third region and a fourth region, wherein the areas of the first region, the second region, the third region and the fourth region are different with respect to each other; and
doping the exposed substrate using rays inclined with respect to the substrate top surface, where the position of the first gate with respect to a border of the first window is chosen such that the inclined doping rays impinge more on the first region than on the second region, while the position of the second gate with respect to a border of the second window is chosen such that the inclined doping rays impinge more on the third region than on the fourth region, so that a threshold voltage of a first transistor comprising the first gate, the first region and the second region, is adjusted relative to a threshold voltage of a second transistor comprising the second gate, the third region and the fourth region.

14. The method of claim 13,
wherein the inclined doping rays are simultaneously used for carrying out a halo implant process.

15. The method of claim 14,
wherein choosing the position of the first gate with respect to the first window border comprises choosing a first distance between the centre of the first gate and the first window border, and wherein choosing the position of the second gate with respect to the second window border comprises choosing a second distance between the centre of the second gate and the second window border.

16. The method of claim 15,
wherein a first side wall spacer covering at least a part of the side wall of the first gate is formed, and wherein a second side wall spacer covering at least a part of the side wall of the second gate is formed.

17. The method of claim 16,
wherein the first distance, the second distance and the shapes of the first side wall spacer and the second side wall spacer are chosen such that the inclined doping rays impinge only on the first region and the third region.

18. The method of claim 17,
wherein a distance d between a part of the first side wall spacer formed within the second region and a part of the window border facing the first side wall spacer part is less than tan(alpha)*rh, wherein alpha is the acute angle between the inclined doping rays and a normal axis to the substrate top surface, and rh is the thickness of the mask layer.

19. The method of claim 17,
wherein a distance d2 between a part of the second side wall spacer formed within the fourth region and a part of the window border facing the second side wall spacer part is less than tan(alpha)*rh, wherein alpha is the acute angle between the inclined doping rays and a normal axis to the substrate top surface, and rh is the thickness of the mask layer.

20. The method of claim 18,
wherein an extension implant is carried out after having formed the first side wall spacer and the second side wall spacer.

21. The method of claim 14,
wherein the doses of the inclined doping rays range between 1e13 cm^-3 and 1e14 cm^-3.

22. The method of claim 14,
wherein the angle of the inclined doping rays ranges between 30 and 45 degrees.

23. The method of claim 20,
wherein, after having carried out the extension implant, the following processes are carried out:
doping the first region to form a source region; and
doping the second region to form a drain region, or vice versa.

24. The method of claim 20,
wherein, after having carried out the extension implant, the following processes are carried out:
doping the third region to form a source region; and
doping the fourth region to form a drain region, or vice versa.

25. The method of claim 16,
further comprising:
removing the single mask layer, the first side wall spacer and the second side wall spacer, to form the first transistor comprising the first gate, the first region and the second region; and
the second transistor comprising the second gate, the third region and the fourth region,
wherein the threshold voltage of the first transistor is different from the threshold voltage of the second transistor.

* * * * *